(12) United States Patent
West et al.

(10) Patent No.: US 6,804,809 B1
(45) Date of Patent: Oct. 12, 2004

(54) SYSTEM AND METHOD FOR DEFINING A SEMICONDUCTOR DEVICE LAYOUT

(75) Inventors: Peter West, Minneapolis, MN (US); Ronald Harlan, Norwood Young America, MN (US); Steven L. Kosier, Lakeville, MN (US)

(73) Assignee: PolarFab, LLC, Bloomington, MN (US)

( * ) Notice: Subject to any disclaimer, the term of this patent is extended or adjusted under 35 U.S.C. 154(b) by 63 days.

(21) Appl. No.: 10/283,834

(22) Filed: Oct. 30, 2002

(51) Int. Cl.[7] .................................................. G06F 9/45
(52) U.S. Cl. .................................. 716/11; 716/8; 716/9; 716/10
(58) Field of Search ........................ 716/8–11, 17–21; 257/202–206, 211, 336, 337, 368

(56) References Cited

U.S. PATENT DOCUMENTS

| | | | | |
|---|---|---|---|---|
| 4,748,488 A | * | 5/1988 | Suzuki et al. ............... | 257/207 |
| 4,837,461 A | * | 6/1989 | Kubosawa et al. .......... | 326/47 |
| 4,870,598 A | | 9/1989 | Shaw et al. ................. | 364/491 |
| 5,436,485 A | * | 7/1995 | Shikatani et al. ........... | 257/368 |
| 5,459,340 A | * | 10/1995 | Anderson et al. ........... | 257/203 |
| 5,461,577 A | * | 10/1995 | Shaw et al. .................... | 716/17 |
| 5,790,417 A | * | 8/1998 | Chao et al. .................... | 716/21 |
| 5,834,845 A | | 11/1998 | Stolmeijer ................... | 257/752 |
| 6,384,480 B1 | | 5/2002 | McTeer ....................... | 257/750 |
| 6,407,434 B1 | * | 6/2002 | Rostoker et al. ............ | 257/401 |
| 6,525,350 B1 | * | 2/2003 | Kinoshita et al. ........... | 257/202 |
| 2002/0185681 A1 | * | 12/2002 | Nakano et al. ............. | 257/336 |
| 2003/0161203 A1 | * | 8/2003 | Alexanian ................... | 365/200 |

OTHER PUBLICATIONS

A Skill ™–based Library for Retargetable Embedded Analog Cores, Mar. 2001.

* cited by examiner

Primary Examiner—Vuthe Siek
Assistant Examiner—Naum Levin
(74) Attorney, Agent, or Firm—Kinney & Lange, P.A.

(57) ABSTRACT

A method to create a layout of a semiconductor device for the purpose of fabricating the semiconductor device involves first providing a plurality of partial-area layout cells and then generating the layout of the semiconductor device by placing the plurality of the partial-area layout cells together. The layout can be conveniently expanded to a desirable size by replicating or repeating certain repeatable cells.

23 Claims, 7 Drawing Sheets

SYSTEM AND METHOD FOR DEFINING A SEMICONDUCTOR DEVICE LAYOUT

BACKGROUND OF THE INVENTION

The present invention relates to a system and method for generating a layout of a semiconductor device, and more particularly to a system and method to efficiently customize the layout for a semiconductor device based on existing layout information.

Semiconductor circuits or "chips" have become widely used in nearly all machines and products that have electronic components. A typical electronic circuit design is initially conceived and tested schematically by a circuit design engineer, with a number of components and devices connected together to yield a circuit with desired performance characteristics. Once the circuit has been designed, it must be reconfigured from schematic form into a layout form. This is typically a job for a physical design engineer, working in concert with the circuit design engineer to create a graphic layout specifying a suitable semiconductor implementation of the circuit. The graphic layout of the device, which specifies all of the semiconductor device layout parameters, is then submitted to a foundry for fabrication of the chip.

Laying out an electronic circuit in a semiconductor implementation is a complicated task, and is governed by a large number of geometric rules. A layout of a semiconductor device contains geometric features such as polygons to indicate proper size, shape, location and separation of a certain physical feature of the circuit (a sub-component within a semiconductor device) from other physical features, or to indicate proper isolation and separation among the circuit elements. The layout of a typical semiconductor device contains multiple drawing layers, each layer having one or more polygons. Generally, the more complicated the device is, the more layers and polygons the layout includes.

Furthermore, because an electronic circuit usually includes a number of components or devices, the layout of each device in an electronic circuit needs not only to include layers that indicate how the device itself is to be fabricated, but also layers that indicate how the device is connected with other devices on the same circuit or external devices, and how a conductive portion or element of the device is connected to other conductive portions or elements of the same device. The latter type of layers generally relate to metallization, which is the formation of electrical contacts to conductive elements in the semiconductor integrated circuit. Many devices further require formation of multilevel metal signal lines for a multilayer substrate on which the semiconductor devices are mounted. To do this, multilayer metallization and intermediate connecting layers, often called vias or via layers, are used to form a proper interconnection between the metallization layers. Through this multilayered structure, proper interconnections are made possible between both the conductive elements within the same device and those that are external. Such multilayer structure further complicates the layout process.

Drawing all of the layers separately and manually is tedious and error prone. In the past decades, efforts were dedicated to the development of layout automation methodologies. For example, basic device cell generators were developed to increase the productivity of layout design. Among the device cell generators, the most commonly used is a technique called parameterized cell, or pcell, developed by Cadence Design Systems, Inc., San Jose, Calif. A pcell is a programmable layout which allows users to specify their own parameters such as transistor size and finger number. It can be created either graphically or using SKILL™ code (SKILL is a trademark of Cadence, Inc.) Parameterized cells (pcells) are basically layout macros. A design engineer completes a pcell by filling in various parameters, and the layout of the pcell automatically changes to reflect these values. Pcells allow design layout at a higher level of abstraction. The pcell capability also allows the move from traditional "polygon pushing" to more automated design styles. Using pcells, a design engineer only needs to maintain a small set of design objects rather than all mask geometries. Because of these advantages, the use of pcells reduce design entry, editing time, and design rule violations.

Using device generators such as pcells, the layout of a single conventional device, such as a diode, a bipolar transistor, or a metal oxide semiconductor field-effect transistor (MOSFET), can be partially standardized in the layout for a certain manufacturing process and are programmed into a standard pcell for a parameterized layout generation. However, the degree of automation using a pcell depends on the degree of successful parameterization. With a transistor pcell, for example, the length, width, number of gate segments, and much more, can be realized by simply changing a parameter value. Furthermore, pieces of parameterized data can automatically appear, disappear, or replicate as a condition of another parameter. For bipolar designs, parameterized data can include arcs, circles, paths, and text. Although virtually any layout data for device designing customization can theoretically be realized using proper parameterization, doing so can be difficult or practically impossible in many situations. Particularly, in a device layout that requires multiple metallization layers, it is difficult or even impossible to incorporate all the necessary layers including the metallization and vias in a standard parameter cell (pcell), and parameterize all necessary layout customization for automatic layout generation. This will still leave a significant part of the layout process labor intensive.

One example of such customization that is difficult to parameterize is sizing. Sometimes a single device having a particular size is desired and this requires generating a layout of the device that has a specific size that is different from the size represented by an available pcell. Due to the intricacies of connectivity in a device having multiple layers, particularly multiple metallization and vias, the size of the layout cannot by realized by changing one or a few layer parameters. As a result, the satisfaction of a sizing requirement is much more complicated than just simply scaling up or down an available starting layout such as a standard pcell.

For example, a very low on-resistance is often required of an input or output drive such as an LDMOSFET (laterally diffused metal oxide semiconductor field-effect transistor). In order to achieve a very low on-resistance, the LDMOSFET needs to be very large. The complete layout of an LDMOSFET may comprise many layers including a gate polysilicon layer (POL), a contact layer (CON) for contact from metal-1 to polysilicon, a metal-1 layer (MT1) for innermost metallization, a via-1 layer (VIA1) for via connecting metal-1 to metal-2, a metal-2 layer (MT2) for second metallization, a via-2 layer (VIA2) via connecting metal-2 to top metal, a top metal layer (MTT) for uppermost metal, and a passivation layer (PSV). Among the necessary layers, the POL, CON, and PSV can be relatively easily incorporated and programmed into a pcell. However, the metallization layers are quite difficult to incorporate into the pcell due to the complexity in patterns and interconnectivities required of them. Although it is possible to construct the complete LDMOSFET driver of a desirable size by starting with a pcell containing all layers except metal layers, sizing the pcell, and then separately manually generating all metal and via layers and then placing them on top of the pcell, the process is time consuming, prone to error and relatively ineffective in optimizing metallization for low on-resistance.

It would therefore be an improvement in the art to provide a system and a method for laying out a semiconductor device that reduces the complexity for physical design engineers in creating layouts for a device of customizable features based on standard layout cells or blocks. Such a system and a method is the subject of the present invention.

BRIEF SUMMARY OF THE INVENTION

The present invention is a method by which a layout of a semiconductor device of customizable features such as a desirable size is constructed using partial-area layout cells. According to the method, a layout of a semiconductor device is generated as follows: providing a plurality of partial-area layout cells, each cell being a part of the layout of the semiconductor device and having at least one layout layer; and generating the layout of the semiconductor device by placing the plurality of the layout cells together. In one embodiment, the layout is expanded to a desirable size by replicating or repeating certain repeatable cells. According to another embodiment, the plurality of the cells in the generated layout define an n×m(n≧3 and m≧3) cell matrix having a column direction and an a row direction. The matrix based layout can be expanded to a desirable size by replicating or repeating certain repeatable columns or rows.

The method, especially when implemented with a computer graphics program, provides an efficient way to quickly generate a layout of a semiconductor device having a customizable feature. The method is particularly useful for generating a layout of a device having any desirable size using pre-made partial-area layout cells, automatic generation of a larger complete layout is made possible. The method particularly simplifies the process of laying out a relatively large device. This improves productivity and minimizes the chances for error in the layout.

DETAILED DESCRIPTION

According to the semiconductor layout method of the present invention, a set (plurality) of partial-area layout cells, each of which is a part of the layout of the semiconductor device, are provided to generate the layout of a semiconductor device by placing the plurality of the partial-area layout cells together. In this description, a partial-area layout cell is generally referred to as "a layout cell" or simply "a cell." The difference between the cells in accordance with the present invention and conventional pcells will become clear through the description.

Certain customization may be realized at the level of individual cells rather than on an overall layout by using partial-area layout cells to generate the layout of a device. For example, the cells may be specifically designed or modified from a standard cell, for customization purposes. Some cells may be more standardized and require less customization than others. More importantly, given a set of cells, certain important customization can be effected by replicating one or more cells without modifying the cells themselves. This inventive concept is illustrated in the following examples with reference to FIGS. 1–7 in which the replication of certain cells efficiently produces a layout of the device and a desirable size.

Nine basic layout cells are chosen in the illustrated exemplary embodiments for convenience. The number of the basic layout cells can be any number that is equal or greater than two. The number of basic cells used is determined as a practical matter by factors such as the characteristics of the layout and the shape of the basic cells selected. The cells do not have to be identical. There are no particular requirements for the shape and size of cells except that proper connectivity between the cells must be maintained. Furthermore, at this level of illustration, the actual structure and type of the underlying device is insignificant. Regardless of the device selected for illustration, the concept illustrated is not limited to a certain type of device. Although the present invention will be illustrated using an LDMOSFET, the invention can be adapted to create a layout of virtually any type of semiconductor device, including without limitation BJTs (e.g., NPNs, LPNPs, VPNPs, HBJTs), diodes (e.g., Schottky diodes, pn junction diodes, pin diodes), resistors (e.g., polysilicon resistors, thin film resistors, diffused resistors), inductors, capacitors (e.g., pn junction capacitors, dielectric capacitors, varactors), MOSFETs (e.g., NMOS, PMOS, lateral DMOS, vertical DMOS, semi-vertical DMOS), JFETs, MESFETs, HEMTs, IGBTs, optical devices (e.g., photodiodes, CCDs, lasers), thyristors, guard rings,. MEMs (e.g., gears, cantilevers, pumps), contacts (e.g., tub contacts, substrate contacts) and ESD devices.

Figure 1:
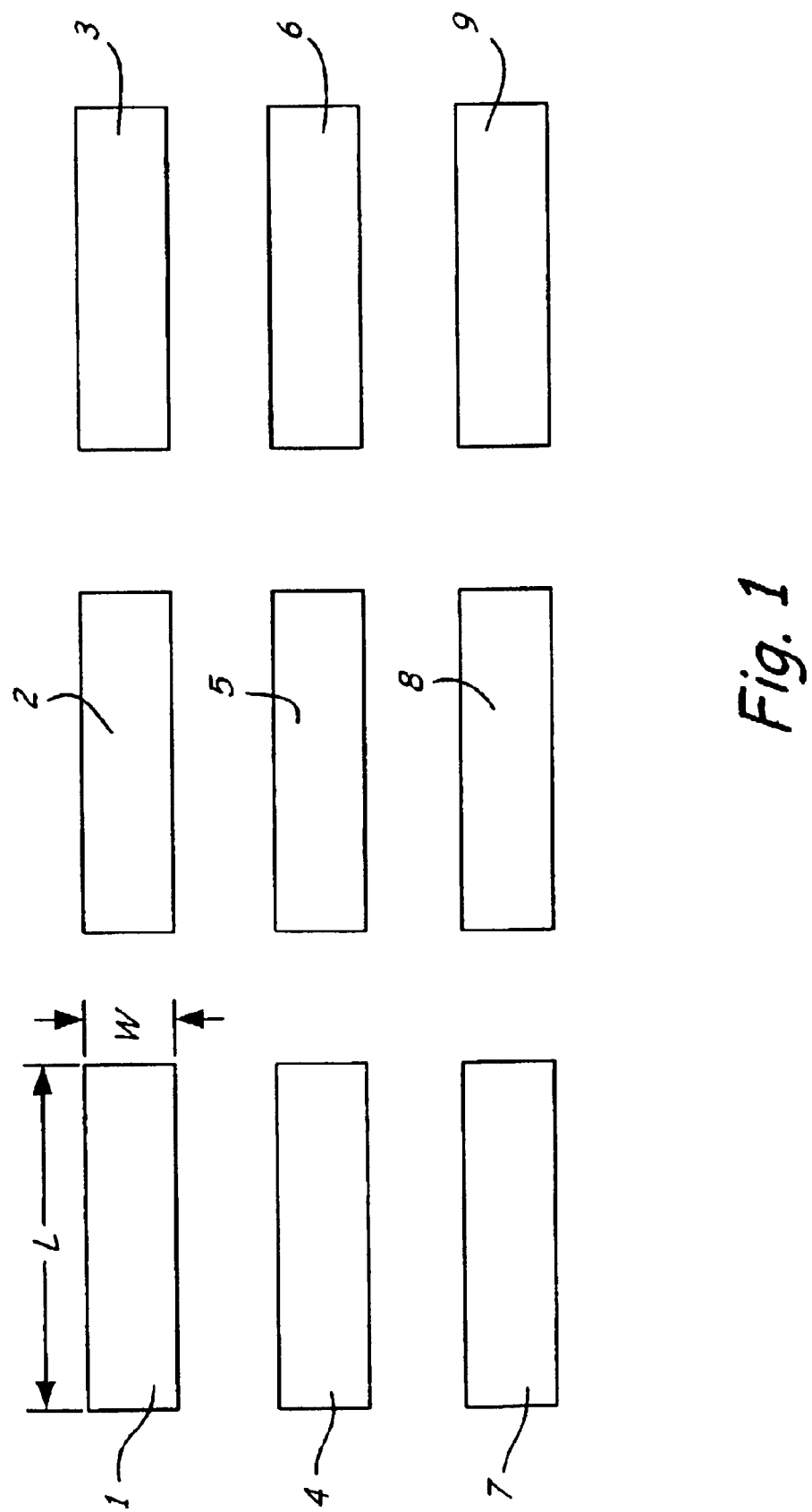
FIG. 1 shows perimeters of nine discrete basic layout cells of a device to be used for generation of a complete layout in accordance with the present invention, wherein the layout layers in the nine basic layout cells are not illustrated.

In FIG. 1, nine basic layout cells 1–9 include an upper-left cell 1, an upper-center cell 2, an upper-right cell 3, a center-left cell 4, a center-center cell 5, a center-right cell 6, a lower-left cell 7, a lower center cell 8, and a lower-right cell 9. Each basic layout cell (1–9) is a partial layout of the device (not shown) and has at least one layout layer (not shown). As exemplified using the upper-left cell 1, each layout cell 1–9 in FIG. 1 is represented by a rectangular box (1–9) having a length L, and a width W. The size of each layout cell 1–9 (i.e., the size of the corresponding rectangular box 1–9) corresponds to, or at least proportionally relates to, the actual size of the part of the device represented by the layout cell. The basic layout cells 1–9 in FIG. 1 are top views as if the device represented in the layout is viewed from above. The discrete cells 1–9 are arranged according to the position and sequence indicated by their names but are not connected yet at this point of illustration. In fact, before these basic layout cells 1–9 are connected as shown next, their particular order in arrangement as shown in FIG. 1 has no significance other than the convenience of a straightforward way to display these cells.

In practice, as the layout process is most likely done using a computer program, each basic layout cell 1–9 in FIG. 1 is a graphic representation of a computer file that contains the corresponding partial layout information of the device.

Figure 2:
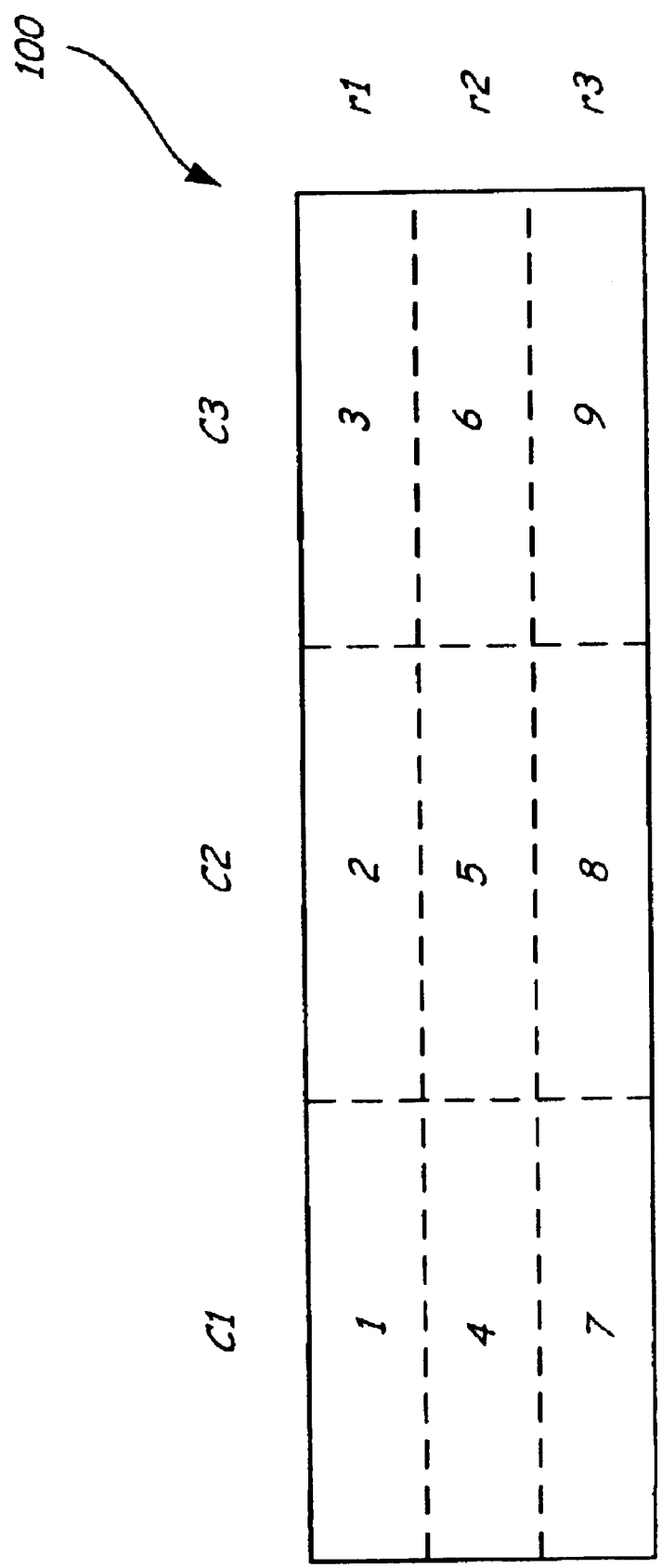
FIG. 2 is an overall layout created by placing the basic layout cells in FIG. 1 together flush against one another.

FIG. 2 shows an overall layout 100 created by placing the nine basic layout cells 1–9 together. The cells 1–9 are docked together according to the position and sequence indicated by their names. The cells are butted and flushed against each other along their sides. When connected together as shown in FIG. 2, the basic layout cells 1–9 constitute an overall layout 100 of the represented device.

In order to maintain proper connectivity between the rectangular cells, the length of the cells that belong to the same column should be identical and the width of the cells that belong to the same row should also be identical. In practice, when each basic layout cell 1–9 in FIG. 1 is a graphic representation of a computer file, the layout 100 is generated by a graphics program on computer.

An immediate benefit of using basic layout cells as building blocks to generate a complete layout is the modularity of the system. A collection of basic layout cells for a certain type of device can be stored in a computer for the purpose of generating a customized layout of a customized device. Because a certain customization may require making changes only in a certain area(s) of a standard or starting layout, generating a customized layout may only require customization of certain layout cell(s) rather than that of every layout cell.

In addition, because certain customization may require making changes in one or more but not all of the layout layers, cells that have standard layout layers may be used to generate layout 100, which is then used as an intermediate layout to generate a final layout by adding further layers thereto.

Significantly, because a cell, or even a group of cells, can be easily replicated (by either duplication or multiplication), the method in accordance with the present invention is particularly useful in situations where the required customization is changing the size of a device. In a case where a computer program is used and each cell exists as a computer graphics file, replicating a cell involves simple multiple "calling" of the corresponding file. As illustrated below with reference to FIGS. 3–7 in various applications of the layout method using basic layout cells as building blocks, not only is the size of a device easily scaled by replicating certain layout cells, but also a great deal of flexibility is made available in terms of choosing particular areas of the layout (and their corresponding layout cells) to be duplicated.

An application of the present inventive layout method is described below reference to FIGS. 2–3. The layout 100 in FIG. 2 is now used as a starting point for customization. It should be noted that using layout 100 as a starting point for customization is only for the convenience of illustration.

In FIG. 2, the nine basic layout cells 1–9 in layout 100 define a 3×3 cell matrix having a column direction (same as the direction of width W of the cells) and a row direction (same as the direction of length L of the cells). The cell matrix having three basic columns which include a left column c1, a center column c2 and a right column c3, and three basic rows which include an upper row r1, a center row r2 and a bottom row r3. The nine basic cells include: four corner cells, which include an upper-left cell 1, an upper-right cell 3, a lower-left cell 7, and a lower-right cell 9; four side cells, which include an upper-center cell 2, a center-left cell 4, a center-right cell 6, and a lower-center cell 8; and a center-center cell 5.

Figure 3:
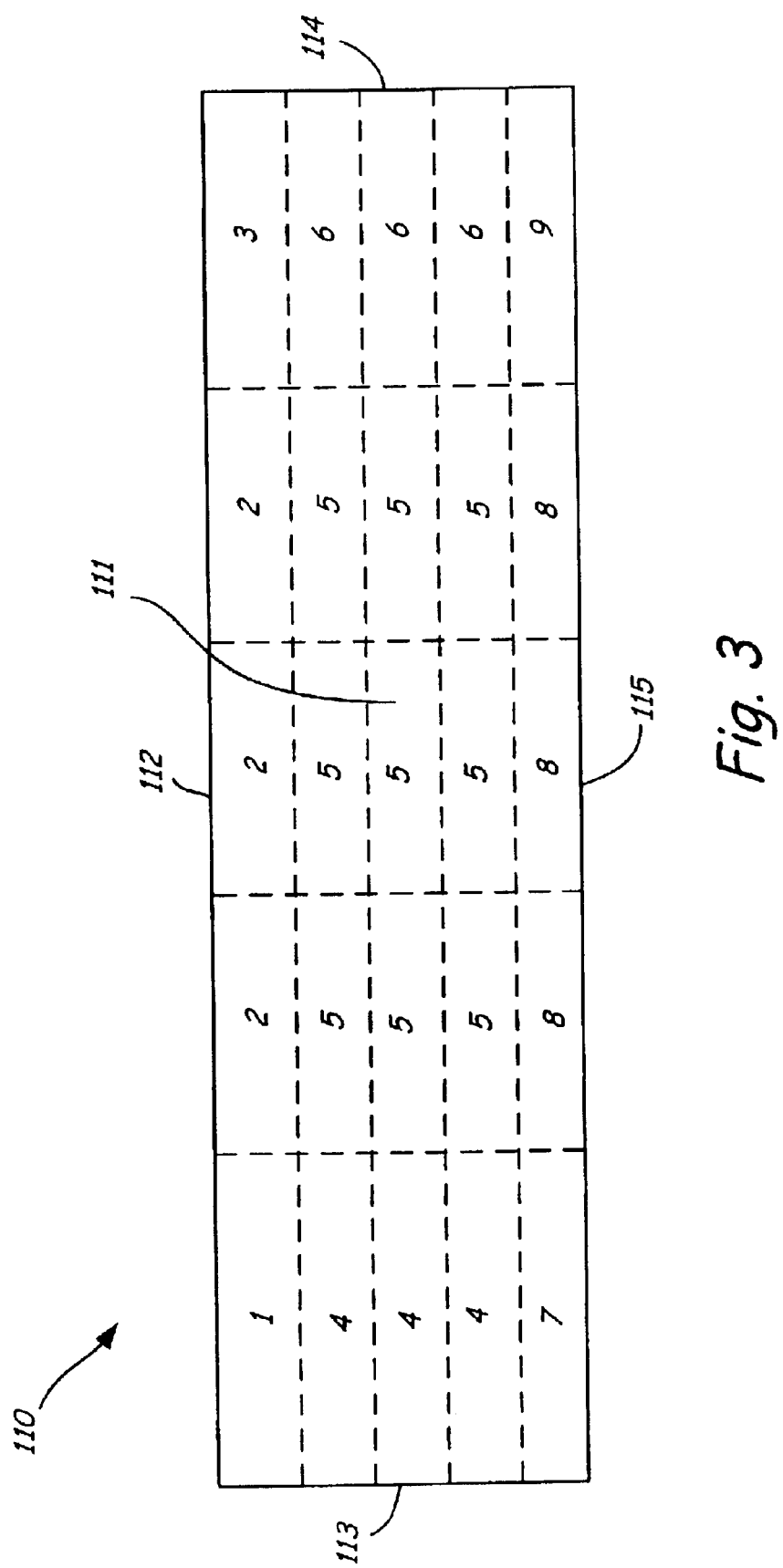
FIG. 3 is an expanded layout generated by expanding the layout in FIG. 2 by replicating selected basic layout cells.

FIG. 3 shows an expanded layout 110 generated by expanding layout 100 by replicating selected cells or columns/rows thereof. The particular layout 110 in FIG. 3 is generated by replicating the center column c2 and the center row r2 of the layout 100 in FIG. 2. "Replicating" a column or row means that an identical column or row having identical cells that are arranged in an identical manner with respect to each other is added to the matrix. The expanded layout 110 in FIG. 3 now has a 5×5 matrix of twenty five layout cells, among which are nine original basic cells (1–9 in FIG. 2) and sixteen additional layout cells generated by replicating the basic cells. Compared to layout 100 in FIG. 2, layout 110 in FIG. 3 has an enlarged center portion 111 consisted of fifteen identical center-center the cells 5. Layout 110 also has four lengthened sides 112, 113, 114, 115 each having a repeated center tandem of side cells 2, 4, 6, and 8, respectively. Four corner cells 1, 3, 7 and 9 remain unchanged. Layout 110 in FIG. 3 therefore represents a device that is similar to but larger than the device represented by layout 100 in FIG. 2. Because the number of the cells in the resultant layout 110 is unlimited according to the basic concept of the present invention, the method described can be used to generate a layout for a device of any size.

Expansion of the cell matrix can be done using any scheme as long as the resultant expanded layout (e.g., 110 in FIG. 3) is a usable layout of the desired device. For example, instead of expanding by replicating center column c2 and center row r2, any other column, row or a combination thereof, can be replicated a number of times to expand the layout to a desirable size. The resultant layout 110 can be a matrix of n×m (n≧3 and m≧3). However, not every scheme of expansion is useful since some schemes will result in nonfunctional layout due to improper connectivities between the cells. Furthermore, certain preferences of expansion schemes may be taken over others based on particular device design considerations. The expansion scheme as shown in FIG. 3, for example, is particularly suitable for generating a layout for a large LDMOSFET drive that has its source, drain and gate contacts disposed on one of the sides respectively, as described below.

Figure 4:
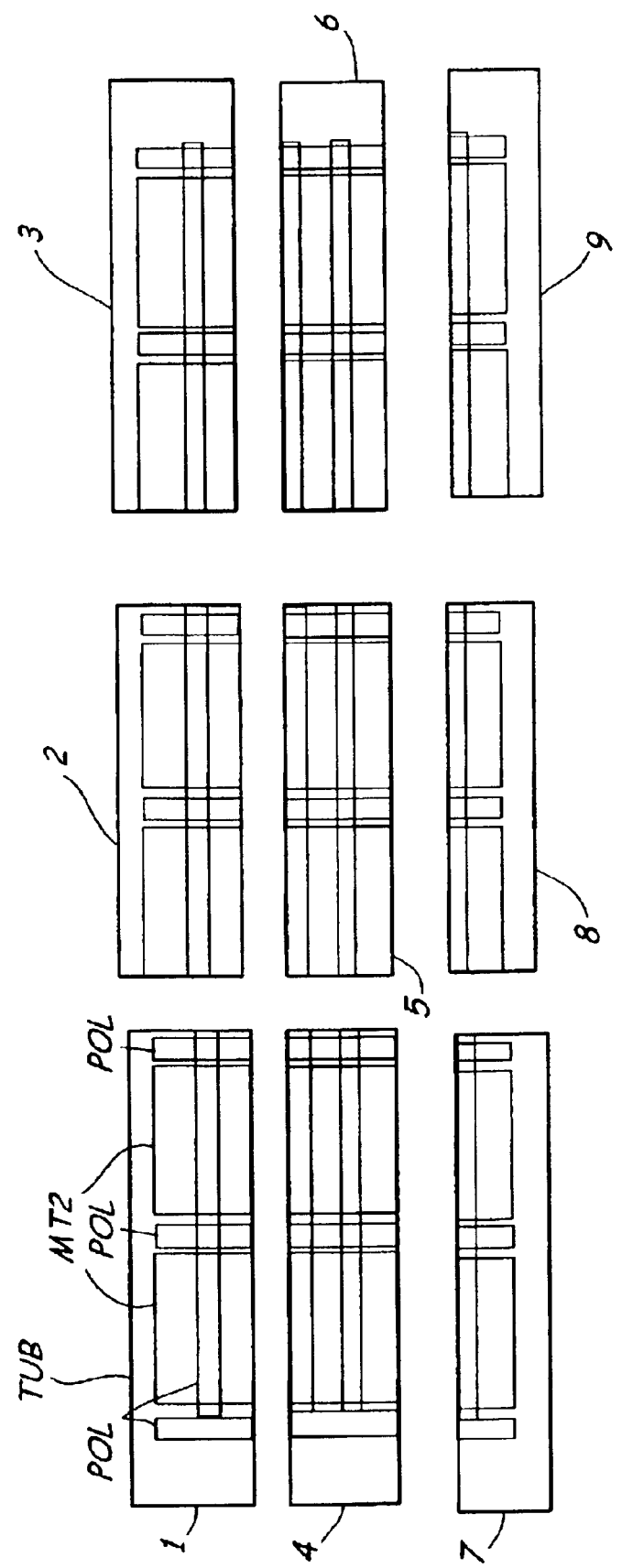
FIG. 4 shows nine basic layout cells of an LDMOSFET drive to be used for generation of a complete layout of the device in accordance with the present invention, wherein only three of the layout layers are shown for illustration purposes.

FIG. 4 shows nine basic layout cells 1–9 for an LDMOSFET drive. Unlike the generic representations of these layout cells 1–9 in FIGS. 1–3 which do not show any layout layers, layout cells 1–9 for an LDMOSFET drive in FIG. 4 show some (but not all) of the layers they have in order to further illustrate the layer connectivity between the cells and intrinsic perimeter requirements of the layout for an LDMOSFET drive.

Each cell 1–9 for an LDMOSFET drive in FIG. 4 may include many layout layers, including but not limited to: a tubbing layer (TUB), a gate polysilicon layer (POL), a contact layer (CON) for contact from metal 1 to polysilicon, a metal-1 layer (MT1) for innermost metallization, a via-1 layer (VIA1) for via connecting metal 1 to metal 2, and a metal-2 layer (MT2) for second metallization. Because most layer details are not essential to the concept of the present invention, only three of the above six layers, namely TUB, POL and MT2, are shown in cells 1–9 in FIG. 4. As exemplified in upper-left cell 1, the outer box TUB represents the tubbing layer, two wide strips MT2 represent metal-2 layer, and the four narrow strips POL (three vertical and one horizontal) represent the gate polysilicon layer. Other layers that are not essential for demonstrating the present invention are omitted.

Figure 5:
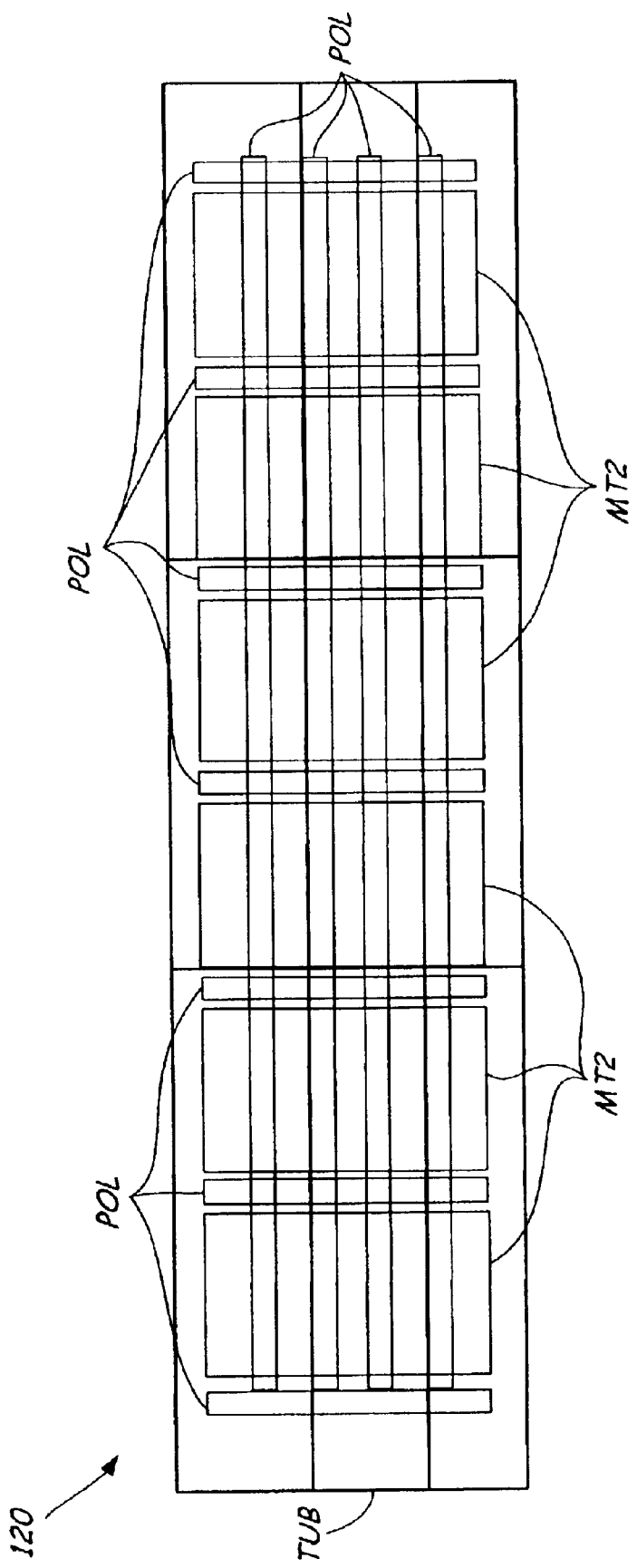
FIG. 5 shows an overall layout created by placing the nine basic cells of the LDMOSFET together flush against one another.

FIG. 5 shows an overall layout 120 created by placing the nine basic cells 1–9 of the LDMOSFET together. As in FIG.

2, the layout cells 1–9 are docked together according to the position and sequence indicated by their names. The cells are butted and flushed against each other along their sides. When connected together as shown in FIG. 5, the basic layout cells 1–9 constitute an overall layout 120 of the represented device. Unlike the generic representations of the expanded layout 100 in FIG. 2, however, the layout 120 for an LDMOSFET drive is now shown in FIG. 5 to have three particular layers as described above. The overall connectivity between the layout cells 1–9 is illustrated by the respective connectivity in each of the three layers TUB, MT2 and POL.

Figure 6:
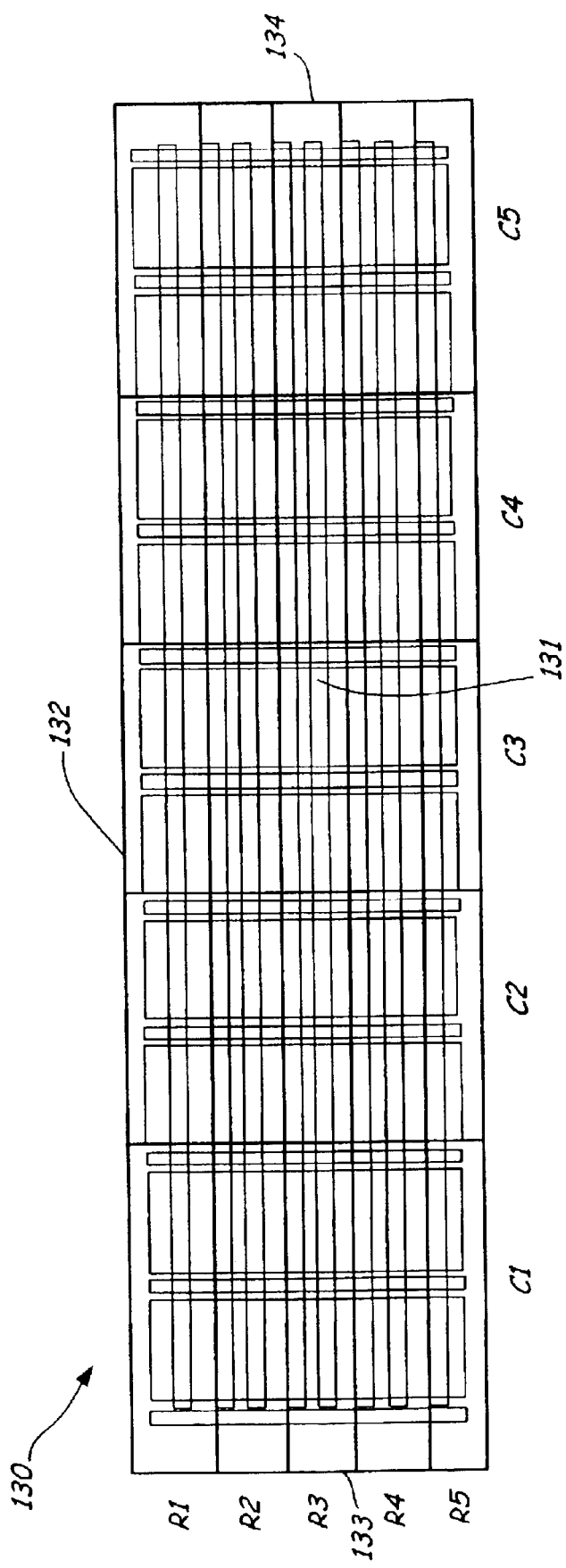
FIG. 6 is an expanded layout of the LDMOSFET drive generated using the expanding scheme described previously with reference to FIGS. 2–3.

FIG. 6 shows an expanded layout 130 of the LDMOSFET drive generated using the expansion scheme described previously with reference to FIGS. 2–3. Unlike the generic representations of the expanded layout 110 in FIG. 3, however, the layout 130 for an LDMOSFET drive is now shown in FIG. 6 to have three particular layers as described above.

As shown in FIG. 6, the expanded layout 130 is a 5 row×5 column matrix. It has five columns C1–C5, and five rows R1–R5. The effect of the expansion with respect to the individual cells is described as follows. The four corner cells (upper-left cell 1, upper-right cell 3, lower-left cell 7, and lower-right cell 9) remain unchanged and not duplicated. Four side cells (upper-center cell 2, a center-left cell 4, a center-right cell 6, and a lower-center cell 8) have each been duplicated twice to generate identical side cells. The above corner cells and side cells and their corresponding identical duplicate cells make up four sides of the layout 30 (the left and right columns C1 and C5 and the top and bottom rows R1 and R5). Compared to layout 120 in FIG. 5, layout 130 in FIG. 6 has an enlarged center portion 131 consisting of fifteen identical center-center cells 5. Layout 130 also has four lengthened sides 132, 133, 134, 135 each having a repeated center tandem of side cells 2, 4, 6, and 8, respectively. Layout 130 in FIG. 6 therefore represents a device that is similar to but larger than the device represented by layout 120 in FIG. 5. Because the number of the cells in the resultant layout 130 is unlimited according to the basic concept of the present invention, the method described can be used to generate a layout for a device of any size. For example, using cells of an individual size equivalent to a device area of 37.50 µm×10.60 µm, a 100 row×100 column expanded layout may be generated to represent a very large device of a size 3.98 mm².

Preferably, as any layers as possible should be included in the basic cells 1–9 in the first place such that layout 130 is close to a complete layout of the device. However, as shown next in FIG. 7, some layers may be practically unsuitable for inclusion in the basic cells. If the basic cells 1–9 do not already include all the necessary layers, missing layers such as MTT, VIA2 and PSV layers may be added to layout 130 to generate a more complete layout. In the embodiment illustrated in FIGS. 4–6, for example, MTT layer is not included in the layout cells and must be drawn on top of the layout cells after the automatic expansion illustrated in FIG. 6 accomplished.

Figure 7:
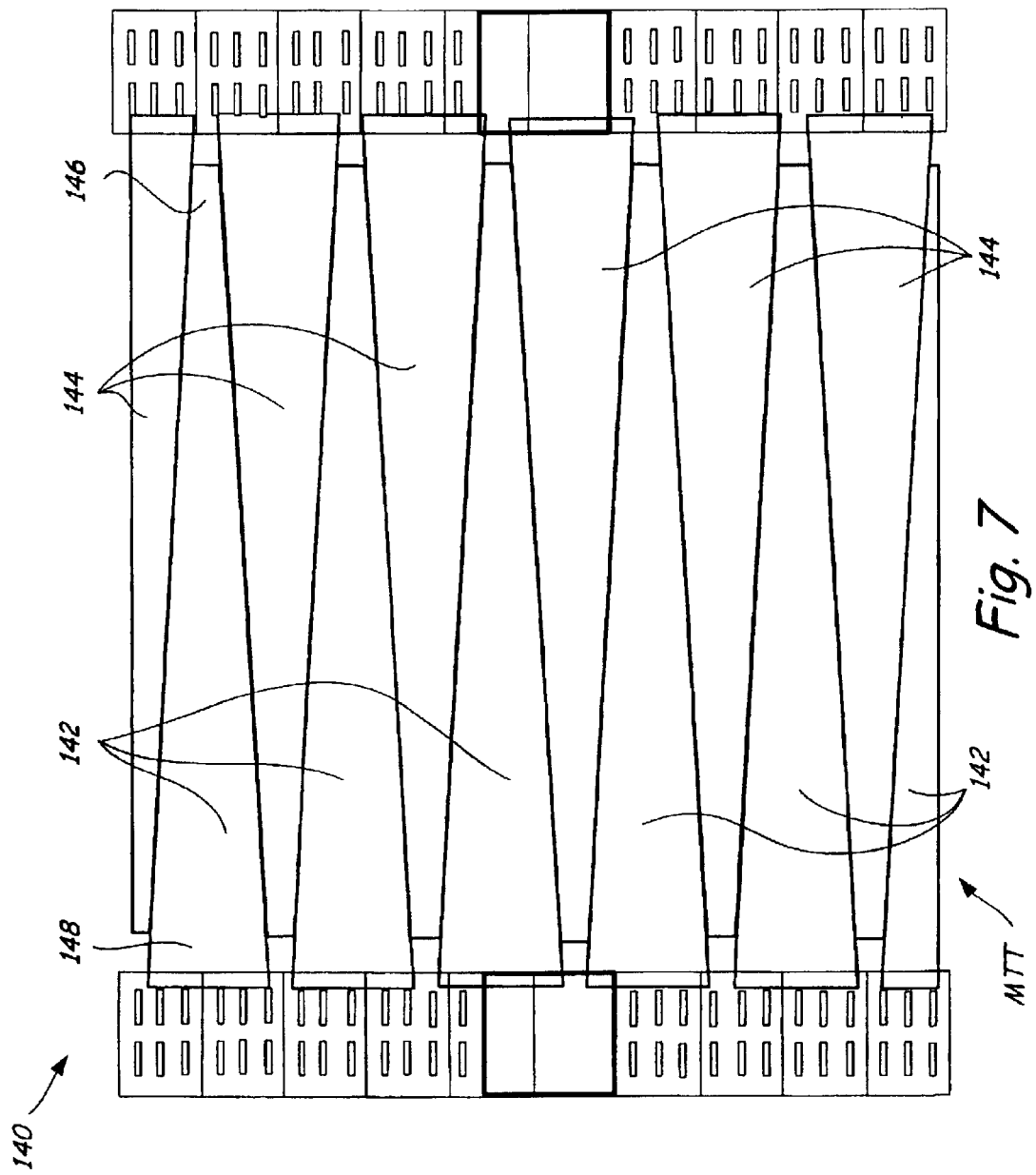
FIG. 7 shows a top metal layout layer (MTT) of the LDMOSFET only.

FIG. 7 shows an MTT layer 140 (top metal layer) of the LDMOSFET only. To more clearly illustrate the difficulty of including MTT layer in layout cells, MTT layer 140 shown in FIG. 7 has a suitable size that is to be applied over a 100 row×100 column expanded layout (not shown), rather than over a 5 row×5 column expanded layout 130 in FIG. 6. The 100 row×100 column expanded layout can be generated using a similar method described above to generate the illustrative 5 row×5 column expanded layout 130 in FIG. 6.

As shown in FIG. 7, MTT layer 140 has two sets of MTT fingers 142 and 144. Each MTT finger 142 or 144 has a beveled shape with a thin end 146 and a thick end 148, as exemplified in the MTT finger 142 at the top. MTT fingers 142 and 144 are interleaved and arranged in opposite directions with respect to each other. Although the beveled MTT fingers 142 or 144 are more difficult to draw than square ones, the beveled MTT fingers 142 or 144 are preferred because they result in better performance such as a lower on-resistance. The exact shapes and dimensions of MTT fingers 142 or 144 are not critical. However, MTT fingers 142 or 144 must be wide enough at the thin end 146 to allow sufficient room to place a VIA2 (not shown) connecting MTT fingers 142 or 144 to a corresponding vertical MT2 finger (not shown). Generally, a smaller width of MTT fingers 142 or 144 allows higher current densities before electromigration limits are reached on VIA2. At very small finger widths, however, on-resistance will increase due to an increasing fraction of area that is not occupied by MTT. Conversely, at very large finger widths, MT2 resistance contribution can become significant and result in higher on-resistance.

Unlike an MTT layer that has straight square or rectangular MTT fingers (not shown), MTT layer 140 shown in FIG. 7 that has the above preferred beveled MTT fingers 142 or 144 is difficult or impossible to be incorporated into cells as described above. Particularly, the beveled line features of MTT fingers 142 and 144 make it impossible to have a center portion of the layout that can be made of a repetition of multiple identical center cells, thus making the automatic expansion process from the basic cells to an expanded layout much more complicated. As illustrated in FIG. 3, central portion 111 that has repeatable identical center cells 5 is the primary reason why a simple expansion scheme exists for generating expanded layout 111. Adding MTT layer having beveled line features thus makes unavailable a convenient expansion scheme as illustrated in FIG. 3. To avoid this problem in such a case, instead of trying to incorporate all the necessary layers into basic layout cells, a good balanced method is to include several inner layers (POL, CON, MT1, VIA1 and MT2) in the basic layout cells (such as layout cells 1–9), use the basic layers to generate an intermediate layout (such as layout 130), and add other layers such as MTT and VIA2 later to the intermediate layout to generate a more complete layout. This allows a significant degree of automation while also allowing design flexibility of MTT and VIA2 layers.

The foregoing discussions regarding MTT layer are only to illustrate that in particular situations, such as for the purpose of generating a layout for a large size device, it may be undesirable or even impossible to include all the necessary layers into cells. These discussions do not in any way suggest that the general cell building concept of the present election is inherently limited to inclusion, or exclusion, of any particular layers.

Although the present invention has been described with reference to preferred embodiments, workers skilled in the art will recognize that changes may be made in form and detail without departing from the spirit and scope of the invention. Particularly, although the present invention has been illustrated using a matrix for a device that has a layout of a rectangle shape, the invention can be adapted for a device layout of any other shape. Furthermore, the actual processes of customization as illustrated are not essential to the present invention. The essence of the invention is to generate and/or customize a layout of the device based on layout cells, regardless of how the cells are placed together and how new cells are created or instantiated. That is, as long as the final layout is generated using a plurality of the layout cells in accordance with the present invention and the final layout is a usable layout of the desired device, it is within the variations of the present invention to change the specific manner of providing and placing the necessary cells together.

What is claimed is:

1. A method of generating a layout of a semiconductor device for the purpose of fabricating the semiconductor device, the method comprising:

providing a plurality of layout cells, each cell being a part of the layout of the semiconductor device and having at least one layout layer; and generating the layout of the semiconductor device by placing the plurality of the layout cells together, wherein the plurality of the cells in the generated layout define an n×m (n≧3 and m≧3) cell matrix having a column direction and a row direction, the cell matrix having at least three basic columns which include a left, a center and a right column and three basic rows which include an upper, a center and a bottom row, and the three basic columns and the three basic rows comprising a set of nine basic cells which include: four corner cells which include an upper-left cell, an upper-right cell, a lower-left cell, and a lower-right cell, four side cells which include an upper-center cell, a center left cell, a center right cell, and a lower center cell; and a center-center cell.

2. The method of claim 1, wherein the step of providing a plurality of layout cells comprises:

providing a plurality of basic layout cells; and providing at least one additional layout cell which is an identical duplication of one of the plurality of basic layout cells.

3. The method of claim 1, wherein the plurality of layout cells are rectangular or square shaped.

4. The method of claim 1, wherein the plurality of layout cells are identical in size.

5. The method of claim 1, wherein the matrix further comprises at least one additional column and/row.

6. The method of claim 5, the additional column or row is an identical duplicate of the center column or rows.

7. The method of claim 6, wherein the additional column or row is an identical duplicate of the center column or rows.

8. The method of claim 1, wherein the values of n and are selected such that the layout generated has a desired size.

9. The method of claim 1, wherein each cell has a length measured in the row direction and a width measured in the column direction, the length of the cells that belong to the same column being identical and the width of the cells that belong to the row being identical.

10. The method of claim 9, wherein the plurality of cells have identical lengths and identical widths.

11. The method of claim 1, wherein each cell comprises at least two layers selected from the group consisting of a gate polysilicon layer (POL), a metal 1 layer (MT1) for innermost metallization, a contact layer (CON) for contact from metal 1 to polysilicon, a metal 2 layer (MT2) for thin middle metallization, a via 1 layer (VIA1) for via connecting metal 1 to metal 2, a passivation layer (PSV), a top metal layer (MTT) for thick uppermost metal and a via 2 layer (VA2) via connecting metal 2 to top metal.

12. The method of claim 11, wherein each cell comprises at least six layers selected from the group.

13. The method of claim 12, wherein the at least six layers are POL, MT1, CON, MT2, VIA1, and PSV.

14. The method of claim 1, further comprising:

adding an additional layer to the generated layout.

15. The method of claim 14, wherein the additional layer is a top metal layout layer (MTT) or a via-2 layer (VIA2).

16. The method of claim 1, wherein the semiconductor device is selected from the group consisting of BJTs, diodes, resistors, inductors, capacitors, MOSFITs, MESFITs, HEMTs, IGBTs, optical devices, thyristors, guard rings, MEMs and ESD) devices.

17. The method of claim 1, wherein the device is a Lateral Diffusion MOSFET (LDMOSFET).

18. The method of claim 1, wherein the plurality of layout cells are predetermined and the step of generating the layout is done using a graphics program on a computer.

19. A layout of a semiconductor device for the purpose of fabricating the semiconductor device, the layout comprising:

a first layout cell;

a second layout cell; and a third layout cell, wherein each layout cell is a part of the layout of the semiconductor device and has at least one layer, the first, second and third layout cell arc placed and connected together, and wherein the layout further comprising a plurality of additional cells, wherein the first, second and third layout cells and the plurality of additional layout cells together define an n×(n≧3 and m≧3) cell matrix having a column direction and a row direction, the cell matrix having at least three basic columns which include a left, a center and a right column and three basic rows which include an upper, a center and a bottom row, and the three basic columns and the three basic rows comprising a set of nine basic cells which include: four corner cells which include an upper-left cell, an upper-right cell, a lower-left cell, and a lower-right cell, four side cells which include an upper-center cell, a center left cell, a center right cell, and a lower center cell; and a center-center cell and at least one of the first, second and third layout cells is an identical replication of another of the first, second and third layout cells.

20. The method of claim 19, wherein the matrix further comprises at least one additional column and/or row.

21. The method of claim 20, the additional column or row is an identical replication of one of the three basic column columns of rows.

22. The method of claim 21, the additional column or row is an identical replication of the center column or row.

23. The method of claim 19, wherein each cell has a length measured in the row direction and a width measured in the column direction, the length of the cells that belong to the same column being identical and the width of the cells that belong to the same row being identical.

* * * * *

UNITED STATES PATENT AND TRADEMARK OFFICE
CERTIFICATE OF CORRECTION

PATENT NO. : 6,804,809 B1
DATED : October 12, 2004
INVENTOR(S) : Peter West et al.

It is certified that error appears in the above-identified patent and that said Letters Patent is hereby corrected as shown below:

Column 3,
Line 35, delete "size", insert -- size. --
Line 36, delete "using", insert -- Using --

Column 7,
Line 47, delete "any", insert -- many --

Column 9,
Line 44, delete "the center column or rows.", insert -- one of the three basic columns or rows. --
Line 47, delete "n and", insert -- n and m --
Line 53, delete "the row", insert -- the same row --

Column 10,
Line 14, delete "MOSFITs, MESFITs", insert -- MOSFETs, JFETs, MESFETs, --

Signed and Sealed this

Twenty-second Day of February, 2005

JON W. DUDAS
*Director of the United States Patent and Trademark Office*